United States Patent [19]

Noren et al.

[11] Patent Number: 5,340,653
[45] Date of Patent: Aug. 23, 1994

[54] FREE-RADICAL CURABLE COMPOSITIONS COMPRISING VINYL ETHER AND URETHANE MALENATE COMPOUNDS

[75] Inventors: Gerry K. Noren, Hoffman Estates; John J. Krajewski, Wheeling; Sami A. Shama; John M. Zimmerman, both of Hoffman Estates; Danny C. Thompson, Schaumburg; John T. Vandeberg, Barrington, all of Ill.

[73] Assignee: Stamicarbon B.V., Galeen, Netherlands

[21] Appl. No.: 888,885

[22] Filed: May 26, 1992

Related U.S. Application Data

[63] Continuation-in-part of Ser. No. 647,492, Jan. 28, 1991, abandoned, which is a continuation-in-part of Ser. No. 437,374, Nov. 15, 1989, abandoned, and a continuation-in-part of Ser. No. 647,514, Jan. 28, 1991, abandoned, which is a continuation-in-part of Ser. No. 438,540, Nov. 15, 1989, abandoned, and a continuation-in-part of Ser. No. 647,460, Jan. 28, 1991, abandoned, which is a continuation-in-part of Ser. No. 436,826, Nov. 15, 1989, abandoned, which is a continuation-in-part of Ser. No. 404,578, Sep. 8, 1989, abandoned, which is a continuation-in-part of Ser. No. 319,566, Mar. 7, 1989, abandoned, which is a continuation-in-part of Ser. No. 231,362, Aug. 12, 1988, abandoned.

[51] Int. Cl.$^5$ .................. B32B 27/00; B32B 27/40; C08F 2/50; C08F 16/32
[52] U.S. Cl. .................. 428/423.1; 428/425.1; 428/425.6; 428/425.8; 428/423.4; 428/423.9; 428/425.5; 428/423.7; 428/424.2; 522/40; 522/41; 522/44; 522/64; 522/96; 522/92; 522/179; 522/181; 526/323; 526/332; 526/333; 528/83
[58] Field of Search .................. 522/107, 93, 97, 174, 522/181, 179, 92, 96, 98, 40, 41, 44, 64; 525/165; 528/83; 526/323, 332, 333

[56] References Cited

U.S. PATENT DOCUMENTS

| | | |
|---|---|---|
| 2,255,313 | 9/1941 | Ellis . |
| 3,882,189 | 5/1975 | Hudak .................. 528/297 |
| 4,112,146 | 9/1978 | Lazear . |
| 4,200,762 | 4/1980 | Schmidle . |
| 4,422,914 | 12/1983 | Tsao et al. .................. 522/97 |
| 4,447,520 | 5/1984 | Henne et al. . |
| 4,552,830 | 11/1985 | Reardon et al. . |
| 4,585,828 | 4/1986 | Meixner et al. . |
| 4,606,994 | 8/1986 | Illers et al. . |
| 4,721,734 | 1/1988 | Gehlhaus et al. . |
| 4,749,807 | 6/1988 | Lapin et al. . |

FOREIGN PATENT DOCUMENTS 0322808 7/1989 European Pat. Off. .

*Primary Examiner*—Susan W. Berman
*Attorney, Agent, or Firm*—Dressler, Goldsmith, Shore & Milnamow, Ltd.

[57] ABSTRACT

A free-radical radiation curable composition comprising:

a) at least one compound containing one to six vinyl ether groups; and
b) at least one compound containing a urethane backbone with one to six maleate and/or fumarate end groups, wherein the ratio of vinyl ether groups to maleate and/or fumarate groups is in the range of about 1 to about 1:5.

21 Claims, No Drawings

FREE-RADICAL CURABLE COMPOSITIONS COMPRISING VINYL ETHER AND URETHANE MALENATE COMPOUNDS

CROSS-REFERENCE TO RELATED APPLICATIONS

This application is a Continuation-in-Part of U.S. application Ser. No. 647,492, filed Jan. 28, 1991 which is a Continuation-in-Part of U.S. application Ser. No. 437,374, filed Nov. 15, 1989, and U.S. application Ser. No. 647,514, filed Jan. 28, 1991, which is a Continuation-in-Part of U.S. application Ser. No. 438,540, filed Nov. 15, 1989, and application Ser. No. 647,460, filed Jan. 28, 1991, which is a Continuation-in-Part of U.S. application Ser. No. 436,826, filed Nov. 15, 1989, each of which is a Continuation-in-Part of U.S. application Ser. No. 404,578, filed Sep. 8, 1989 which is a Continuation-in-Part of U.S. application Ser. No. 319,566, filed Mar. 7, 1989 which is a Continuation-in-Part of U.S. application Ser. No. 231,362 filed Aug. 12, 1988, all abandoned.

TECHNICAL FIELD

This invention is directed to free-radical curable compositions that are useful as coatings for various substrates.

BACKGROUND OF THE INVENTION

There are many applications that require a rapidly curable coating composition that adheres to a substrate, is flexible, does not discolor and has low toxicity. For example, optical glass fibers are frequently coated with two superposed coatings. The coating which contacts the glass is a relatively soft, primary coating that must satisfactorily adhere to the fiber and be soft enough to resist microbending especially at low service temperatures. The outer, exposed coating is a much harder secondary coating that provides the desired resistance to handling forces yet must be flexible enough to enable the coated fiber to withstand repeated bending without cracking the coating.

Other applications, e.g., optical fabrication, coatings for substrates including glass, metal, wood, plastic, rubber, paper, concrete, and fabrics, and adhesives also require compositions that are fast curing, have low toxicity and provide good physical properties.

Compositions that include (meth)acrylate diluents have been utilized for many of these applications. However, (meth)acrylate diluents are hazardous to human health. Therefore, it is desirable to eliminate or reduce the amount of (meth) acrylate diluents present in a composition.

Vinyl ether compositions have been utilized as replacements for (meth) acrylates. Although vinyl ethers rapidly cure when exposed to ultraviolet light in the presence of a cationic curing catalyst, their cure under cationic conditions leaves catalyst residues that discolor the cured compositions and cause them to be sensitive to water. Furthermore, vinyl ether containing oligomers having relatively high equivalent weights, e.g., an equivalent weight in excess of about 500, do not cationically cure upon exposure to dosages of energy less than 3 Joules per square centimeter. Vinyl ethers do not homopolymerize in the presence of free radical initiators. Therefore, vinyl ethers are not suitable replacements for (meth)acrylates.

Unsaturated polyesters, e.g., maleates and fumarates, are known to be substantially non-toxic, but are unsatisfactory as replacements for (meth) acrylates because their rate of cure when exposed to ultraviolet light is not satisfactory for certain applications.

European Patent Application No. 0 322 808 published on 05.07.89 discloses a radiation curable composition that comprises an ethylenically unsaturated polyester component and a vinyl ether component having an average of at least two vinyl ether groups per molecule of the vinyl ether component. The unsaturated polyester component can be a polymer, oligomer or mixture thereof. Coatings produced from this composition are brittle and hard because of the large amount of ethylenically unsaturated groups in the backbone of the polyester component which leads to short chain segments between cross-links. The vinyl ether component reacts with the ethylenically unsaturated group and results in a high degree of cross-linking that causes the cured composition to be brittle, inflexible and hard. Thus, coatings produced from the composition of this European Patent Application do not possess the needed flexibility and softness for applications, such as optical glass fiber coatings, that require a flexible and soft coating.

SUMMARY OF THE INVENTION

This invention is directed to free-radical radiation curable compositions that comprise (1) at least one compound containing from one to about six vinyl ether groups, and (2) at least one compound containing a urethane backbone and at least one maleate and/or fumarate end group per molecule, wherein the ratio of vinyl ether groups to maleate and/or fumarate groups is in the range of about 5:1 to about 1:5.

These compositions exhibit low toxicity, good cure speeds, good physical properties and are readily synthesized and economical to produce.

The compositions of the present invention can also contain compounds represented by the Formula I:

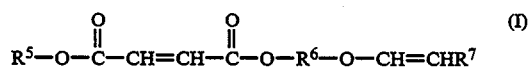

where $R^5$ is hydrogen, alkyl, cycloalkyl, an aryl or alkaryl group with 1 to 10 carbon atoms and at least one optional O or N heteroatom, or a metal ion; $R^6$ is alkyl, cycloalkyl, or an aryl or alkaryl group with 1 to 10 carbon atoms and at least one optional O or N heteroatom; and $R^7$ is hydrogen or methyl.

The compositions of the present invention can, optionally, contain up to about 50% by weight of at least one (meth) acrylate oligomer.

The compositions of the present invention are curable upon exposure to ionizing radiation, actinic energy and heat. The cured compositions exhibit good flexibility, tensile strength, percent elongation and adhesion to substrates. These properties are presently believed to be due to the presence of the urethane backbones in the compound having maleate and/or fumarate end groups. Prior art coatings produced from materials having maleate/fumarate unsaturated backbones tend to be brittle and hard.

Suitable uses for these flexible compositions include optical glass fiber coatings, paper coatings, leather coatings, wood coatings, concrete coatings, fabric coatings, metal coatings, coatings for the metallization of non-metallic substrates, e.g., plastics, coatings for rubber, optical fabrication, lamination of glass and other materials, i.e., composites, dentistry, prosthetics, adhesives, and the like.

The coatings produced from the present compositions are especially useful as primary and secondary coatings for optical glass fibers because of their adherence to the glass, relatively rapid cure, cure to a relatively fully cured condition without the need for postcuring, flexibility, and resistance to microbending.

Thus, the present invention provides compositions having many properties desired by industry while overcoming the shortcomings of the prior art.

DETAILED DESCRIPTION OF PREFERRED EMBODIMENTS

The present invention is directed to free-radical radiation curable compositions that comprise (1) at least one compound containing from one to about six vinyl ether groups; and (2) at least one compound containing a urethane backbone and at least one maleate and/or fumarate end group per molecule, wherein the ratio of vinyl ether groups to maleate and/or fumarate groups in the compositions is in the range of about 5:1 to about 1:5, preferably in the range of about 2:1 to about 1:2 and more preferably about 1:1.

Vinyl Ether Compound

The term "vinyl ether", in its various grammatical forms, refers to a vinyl group bound to an oxygen atom which is bound to a carbon atom.

Preferred compounds containing at least one vinyl ether group have the Formula II:

$R^3-(O-CH=CHR^4)_m$ where m is an integer from 1 to 6;

$R^3$ is a residue of an organic alcohol or polyol, substantially free of maleate or fumarate groups, with a molecular weight of from 56 to about 2000; and $R^4$ is hydrogen or methyl.

In the most preferred vinyl ether compounds m is 2 to 4.

Preferred vinyl ether containing compounds are triethylene glycol divinyl ether, commercially available from ISP Corp. under the trade designation Rapicure DVE-3, butane diol divinyl ether, 1,4-cyclohexane dimethanol divinyl ether, octyl vinyl ether, the like, and mixtures thereof.

Other vinyl ether containing compounds can be produced by conventionally reacting a vinyl ether having either a hydroxyl group or amine group with a saturated backbone containing component. The saturated backbone containing component may be the reaction product of saturated hydroxy functional polyesters, polycarbonates, polycaprolactones, polyethers, Bisphenol-A alkoxylates, siloxanes, or polyethers, with organic polyisocyanates, the like and mixtures thereof. The backbone of the vinyl ether containing compound can contain repeating units. The group linking the vinyl ether group to the saturated backbone (linking group) can be a urethane, urea, ester, ether, or thio group and the like. Preferred linking groups are urethane, urea and ester groups. Mixtures of linking groups can be used.

Representative of the vinyl ethers suitable as reactants in the production of the vinyl ether containing oligomer are conventional hydroxy functional vinyl ethers including triethylene glycol monovinyl ether, 1,4-cyclohexane dimethylol monovinyl ether and 4-hydroxy butylvinyl ether.

Representative of the saturated polyesters are the soluble reaction products of saturated polycarboxylic acids, or their anhydrides, and polyols, preferably diols. Suitable saturated polycarboxylic acids and anhydrides include phthalic acid, isophthalic acid, terephthalic acid, trimellitic acid, tetrahydrophthalic acid, hexahydrophthalic acid, tetrachlorophthalic acid, adipic acid, azelaic acid, sebacic acid, succinic acid, glutaric acid, malonic acid, pimelic acid, suberic acid, 2,2-dimethylsuccinic acid, 3,3-dimethylglutaric acid, 2,2-dimethylglutaric acid, the like, anhydrides thereof and mixtures thereof. Suitable polyols include 1,4-butane diol, 1,S-octane diol, trimethylol propane, pentaerythritol, and the like.

Representative of the saturated polycarbonates are polyhexamethylene carbonate (commercially available from PPG Industries under the trade designation Duracarb 120) and polycyclohexane dimethylene carbonate (commercially available from PPG Industries under the trade designation Duracarb 140).

Representative of the saturated polyethers are polyalkylene oxides, alkyl substituted poly(tetrahydrofurans), and copolymers of the alkyl substituted tetrahydrofurans and a cyclic ether.

Representative of the polyalkylene oxides are poly(propylene oxide) (commercially available from Union Carbide under the trade designation Niax PPG 1025) and poly(tetramethylene glycol) (commercially available from DuPont under the trade designation Terathane 1000).

Alkyl substituted tetrahydrofurans have ring structures that open during polymerization to yield the alkyl substituted poly(tetrahydrofurans). The alkyl group of the alkyl substituted poly(tetrahydrofurans) has about 1 to about 4 carbon atoms. Representative of the alkyl substituted poly(tetrahydrofurans) are poly(2-methyltetrahydrofuran) and poly(3-methyltetrahydrofuran). Representative of the cyclic ethers with which the alkyl substituted tetrahydrofurans can be copolymerized are ethylene oxide, propylene oxide, tetrahydrofuran and the like.

Representative of the polycaprolactones are the Tone Polyol series of products, e.g., Tone 0200, 0221, 0301, 0310, 2201, and 2221, commercially available from Union Carbide, New York, N.Y. Tone Polyol 0200, 0221, 2201, and 2221 are difunctional. Tone Polyol 0301 and 0310 are trifunctional.

Representative of the Bisphenol-A alkoxylates are those wherein the hydroxyalkyl group contains about 2 to about 4 carbon atoms, e.g., hydroxyethyl. A commercial Bisphenol-A alkoxylate is the Bisphenol-A diethoxylate available under the trade designation Dianol 22 from Akzo Research, The Netherlands.

Representative of the siloxanes is poly(dimethylsiloxane) commercially available from Dow Corning under the trade designation DC 193.

Suitable vinyl ether compounds can also be prepared by the procedure shown in U.S. Pat. No. 4,996,282.

Further examples of suitable vinyl ether containing compounds are polyvinyl ether polyurethanes and saturated polyesters such as those shown in U.S. Pat. Nos. 4,472,019, 4,749,807, 4,751,273, and 4,775,732.

Further representative vinyl ether containing compounds are obtained by the metathesis of a cyclic olefin ether having the following general Formula III:

$$\begin{matrix} CR^l = CR^l \\ | \quad | \\ O\text{——}(CR^lR^1)_m \end{matrix} \quad (III)$$

wherein each $R^1$ individually can be hydrogen, an alkyl, aryl, cycloaliphatic or halogen group and m is a number in the range of about 2 to about 10, preferably about 5 to about 6. Metathesis, which is described in Mar., *Advanced Organic Chemistry*, Third Edition, copyright 1985 by John Wiley & Sons, Inc., pp 1036–1039 & 1115, results in the opening of the ring of the cyclic olefin ether to produce a vinyl ether containing compound having the following general Formula IV:

$$Z\text{-}[(CR^lR^1)_m\text{—}O\text{—}CR^l\!=\!CR^l]_y\text{-}Z \quad (IV)$$

wherein $R^1$ and m are as previously described, y is a number in the range of about 2 to about 50, preferably about 2 to about 25, and each Z is an end group; e.g., hydrogen, a vinyl group. The vinyl ether containing compounds of Formula IV can be blended with the other vinyl ether containing compounds of the present invention or those disclosed in U.S. Pat. Nos. 4,472,019, 4,749,807, 4,751,273, and 4,775,732.

The vinyl ether containing compounds generally have a number average molecular weight of from about 150 to about 8000, preferably from about 150 to about 3000 and most preferably from about 200 to about 2000.

When the compositions of the present invention are utilized as a primary coating for optical glass fiber the equivalent weight of the vinyl ether containing compounds is preferably about 500 to about 1500, more preferably about 800 to about 1200.

When the compositions of the present invention are utilized as a secondary coating for optical glass fiber the equivalent weight of the vinyl ether containing compounds is preferably about 300 to about 1000, more preferably about 400 to about 800.

Maleate and/or Fumarate Containing Compound

The compound containing a urethane backbone with one to about six maleate and/or fumarate end groups is preferably the product of the reaction of at least one monohydroxy functional maleate or fumarate compound and at least one organic polyisocyanate compound. The monohydroxy functional maleate or fumarate compound is preferably the reaction product of a half ester of maleic or fumaric acid with ethylene or propylene oxide.

The maleate or fumarate half ester generally has the Formula V:

$$CH_3\text{—}(CH_2)_x\text{-}[O\text{—}CH_2CHR]_y\text{—}O\text{—}\overset{O}{\underset{\|}{C}}\text{—}CH\!=\!CH\text{—}\overset{O}{\underset{\|}{C}}\text{—}OH \quad (V)$$

where
x is 0 to 5; and
y is 0 to 3; and
R is H or methyl.

It is well known that maleate groups isomerize to fumarate groups. Therefore, it is likely that a mixture of maleate and fumarate groups will be present in most of these compounds.

The organic polyisocyanate compound is preferably a difunctional isocyanate monomer or a prepolymer derived from the reaction of an isocyanate monomer and a polyether, polyester or polycarbonate polyol.

Any of a wide variety of organic polyisocyanates, alone or in admixture, can be utilized, diisocyanates alone or in admixture with one another preferably constituting all or almost all of this component. Representative diisocyanates include isophorone diisocyanate (IPDI), toluene diisocyanate (TDI), diphenylmethylene diisocyanate, hexamethylene diisocyanate, cyclohexylene diisocyanate, methylene dicyclohexane diisocyanate, 2,2,4-trimethyl hexamethylene diisocyanate, m-phenylene diisocyanate, 4-chloro-1,3-phenylene diisocyanate, 4,4'-biphenylene diisocyanate, 1,5-naphthylene diisocyanate, 1,4-tetramethylene diisocyanate, 1,6-hexamethylene diisocyanate, 1,10-decamethylene diisocyanate, 1,4-cyclohexylene diisocyanate, and polyalkyloxide and polyester glycol diisocyanates such as polytetramethylene ether glycol terminated with TDI and polyethylene adipate terminated with TDI, respectively.

Representative of the polyalkylene oxides are poly(propylene oxide), commercially available from Union Carbide under the trade designation Niax PPG 1025 and poly(tetramethylene glycol), commercially available from DuPont under the trade designation Terathane 1000.

The compound containing a urethane backbone preferably has a number average molecular weight in the range of from about 150 to 5000, preferably in the range of from about 300 to about 2000.

Optional (Meth)acrylate Compound (Meth) acrylate monomers and oligomers may be used in the compositions of this invention. These (meth)acrylate monomers and oligomers also polymerize by free radical radiation and copolymerize with the other components of the compositions of the present invention. The (meth) acrylate monomers and oligomers can be present in amounts up to 50% by weight of the compositions and preferably have equivalent weights ranging from about 250 to 5000 and average functionalities from about 1 to 4. Higher molecular weight (meth) acrylates are preferred because they are less toxic.

The term "(meth)acrylate", and various grammatical forms thereof, identifies esters that are the reaction product of acrylic or methacrylic acid with a hydroxy group-containing compound.

The (meth) acrylate oligomers suitable for use in the present invention preferably contain an average of at least 1.0, preferably at least about 1.2, and more preferably about 2 to about 4, (meth) acrylate groups per oligomer.

These (meth) acrylate oligomers are illustrated by Cargill 1570, a diacrylate ester of Bisphenol A epichlorohydrin epoxide resin having a number average molecular weight of about 700 daltons that is commercially available from Cargill, Carpentersville, Ill.

The (meth) acrylate oligomer can be a poly(meth)acrylate of an epoxy functional resin. These poly(meth)acrylates preferably contain an average of more than about two (meth) acrylate groups per oligomer and are exemplified by the commercial product Ebecryl 3700 available from Radcure Specialties, Inc., Louisville, Ky., which is the diester of Epon 828 and acrylic acid. Epon 828 is an epoxy functional resin that is a diglycidyl ether of Bisphenol A that is commercially available from Shell Chemicals, New York, N.Y. The number average molecular weight of Ebecryl 3700 is about 500 daltons and of Epon 828 is about 390 daltons.

(Meth) acrylate-modified polyurethanes are also useful as the (meth)acrylate oligomers, especially those that employ a polyester base. Particularly preferred are acrylate-capped polyurethanes that are the urethane reaction products of a hydroxy-functional polyester, especially one having an average of about 2 to about 5 hydroxy groups per molecule, with a monoacrylate monoisocyanate. These acrylate-capped polyurethanes are illustrated by a polyester made by reacting trimethylol propane with a caprolactone to a number average molecular weight of about 600 daltons followed by reaction with three molar proportions of the reaction product of 1 mol of 2-hydroxyethyl acrylate with 1 mol of isophorone diisocyanate. The end product is a polyurethane triacrylate. The urethane-forming reaction is conventionally performed at about 60° C. in the presence of about 1 percent by weight of dibutyltin dilaurate.

A commercial, polyester-based polyacrylate-modified polyurethane that is useful herein is Uvithane 893 available from Thiokol Chemical Corp., Trenton, N.J. The polyester in the Uvithane 893 product is a polyester of adipic acid with about 1.2 molar proportions of ethylene glycol polyesterified to an acid number of less than about 5. This polyester is converted as described above to a polyacrylate-modified polyurethane that is a semi-solid at room temperature and that has an average unsaturation equivalent of about 0.15 to about 0.175 acrylic double bonds per 100 grams of resin.

In polyester processing, the acid number, defined as the number of milligrams of base required to neutralize one gram of polyester, is used to monitor the progress of the reaction. The lower the acid number, the further the reaction has progressed.

A polyacrylate-modified polyurethane that is suitable as the (meth)acrylate oligomer is the reaction product of 1 mol of diisocyanate, 1 mol of 2-hydroxyethyl acrylate (HEA) and about 1 weight percent dibutyltin dilaurate reacted at a temperature of about 40° C. for a time period of 4 hours that is subsequently reacted at a temperature of about 60° C. for a time period of about 2 hours with 1 mol of a commercial hydroxy end-functional caprolactone polyester. A suitable caprolactone polyester is the reaction product of 2 mols caprolactone and 1 mol of ethylene glycol reacted at a temperature of about 60° C. for a time period of 4 hours. A suitable commercial caprolactone polyester is available from Union Carbide Corp., Danbury, CT, under the trade designation Tone M-100 which has a number average molecular weight of about 345 daltons.

The number average molecular weight of the (meth) acrylate oligomers is preferably about 500 to about 15,000, more preferably about 1200 to about 6000, daltons.

The equivalent weight of the (meth)acrylate oligomers is preferably about 250 to about 5000, more preferably about 600 to about 3000.

Compounds Containing Vinyl Ether and Maleate and/or Fumarate Groups

The present invention is also directed to the use of compounds of Formula I in the compositions of the present invention. These compounds can be utilized in the compositions of the present invention. These compounds can be represented by the following Formula I:

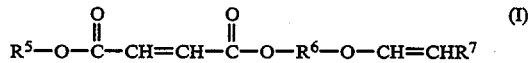

where $R^5$ is hydrogen, alkyl, cycloalkyl, an aryl or alkaryl group with 1 to 10 carbon atoms and at least one optional O or N heteroatom, or a metal ion; $R^6$ is alkyl, cycloalkyl, or an aryl or alkaryl group with 1 to 10 carbon atoms and at least one optional O or N heteroatom; and $R^7$ is hydrogen or methyl.

Conventional Diluents

Other monomers that are known to be used in free radical curable compositions such as N-vinyl pyrrolidinone, N-vinyl imidazole, 2-vinyl pyridine, N-vinyl carbazole, N-vinyl caprolactam, the like, and mixtures thereof can be added to the compositions of the present invention.

Preferred Compositions

The present compositions preferably contain at least one compound containing from one to about six vinyl ether groups in an amount in the range of about 0 to about 80, more preferably about 20 to about 70, weight percent based on the total weight of the composition.

The present compositions preferably contain a compound containing a urethane backbone and from one to about six maleate and/or fumarate end groups in an amount in the range of about 0 to about 80, more preferably about 20 to about 70, weight percent based on the total weight of the composition.

The present compositions preferably contain the compounds of Formula I in an amount in the range of about 0 to about 80, more preferably about 0 to about 30, weight percent based on the total weight of the composition.

The viscosity of the present compositions at a temperature of 25° C. is preferably about 50 to about 25,000, more preferably about 50 to about 15,000, centipoise (cP) and is adjusted to enhance the use of the compositions.

The compositions of the present invention are preferably solvent free and can contain up to about 40 percent by weight of conventional additives such as pigments, fillers, stabilizers and wetting agents.

Curing of the Composition

The compounds and compositions of the present invention can be cured upon exposure to energy such as ionizing radiation, actinic energy, i.e., ultraviolet and visible light, and heat, i.e., thermal cure.

Conventional ionizing radiation sources include electron beam devices. The amount of ionizing radiation required for cure of a 3 mil thick film is about 1 to about 30 megarads.

When cure of the compounds or compositions of the present invention is by exposure to actinic energy of appropriate wavelength, such as ultraviolet light, a photoinitiator can be admixed with the monomer or composition. It is desirable to select the photoinitiator from the group consisting of (1) hydroxy- or alkoxy-functional acetophenone derivatives, preferably hydroxyalkyl phenones, or (2) benzoyl diaryl phosphine oxides. Formulations containing the two different types of ethylenic unsaturation, i.e., the vinyl ether group and the maleate and/or fumarate group, copolymerize rapidly in the presence of the specified groups of photoinitiators to provide a rapid photocure and also interact rapidly upon exposure to other types of energy such as electron beams or gamma radiation when no polymerization initiator is present.

Maleate or fumarate compounds by themselves respond poorly to photocure using, for example, ultraviolet light when the photoinitiator is an ordinary aryl ketone photoinitiator, such as benzophenone. Also, vinyl ethers do not exhibit any substantial curing response to ultraviolet light when these aryl ketone photoinitiators are utilized. Nonetheless, maleate/fumarate terminated compounds and vinyl ethers in admixture respond to the photocure very rapidly when the photoinitiator is correctly selected. The photocure, and the cure upon exposure to other types of energy such as electron beams or gamma radiation when no initiator is present, is especially rapid and effective when both of the described types of unsaturation are provided in polyfunctional compounds, particularly those of resinous character. The fastest cures are obtained when the respective functionalities are present in about the same equivalent amount.

Preferably the photoinitiators are (1) hydroxy- or alkoxy-functional acetophenone derivatives, more preferably hydroxyalkyl phenones, and (2) benzoyl diaryl phosphine oxides.

The acetophenone derivatives that may be used have the Formula VI:

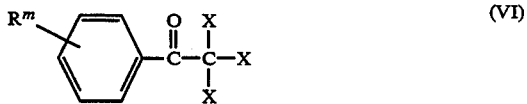

in which $R^m$ is an optional hydrocarbon substituent containing from 1 to 10 carbon atoms and which may be alkyl or aryl, e.g., methyl, ethyl, butyl, octyl or phenyl, X is selected from the group consisting of hydroxy, $C_1$ to $C_4$ alkoxy, $C_1$ to $C_8$ alkyl, cycloalkyl, halogen, and phenyl, or 2 Xs together are cycloalkyl, and at least one X is selected from the group consisting of hydroxy and $C_1$ to $C_4$ alkoxy.

Many compounds have the required structure. The alkoxy groups are preferably methoxy or ethoxy, the alkyl group is preferably methyl or ethyl, the cycloalkyl group is preferably cyclohexyl, and the halogen is preferably chlorine. One commercially available compound is the Ciba-Geigy product Irgacure 651 which has the Formula VII:

Irgacure 184, also from Ciba-Geigy, is another useful acetophenone derivative, and it has the Formula VIII:

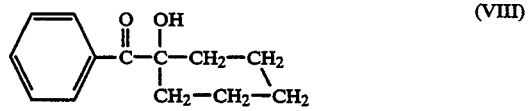

Still another commercially available useful acetophenone derivative is diethoxy acetophenone, available from Upjohn Chemicals, North Haven, Conn., which has the Formula IX:

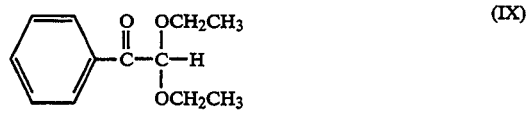

When the photoinitiator is a hydroxy-functional compound, one can define the useful acetophenone derivatives in a somewhat different manner. Thus, the hydroxyalkyl phenones which are preferred herein have the Formula X:

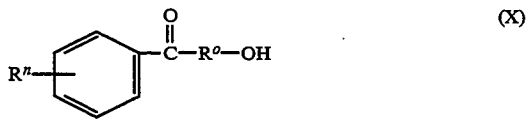

in which $R^0$ is an alkylene group containing from 2–8 carbon atoms and $R^n$ is an optional hydrocarbon substituent containing from 1 to 10 carbon atoms and which may be alkyl or aryl, e.g., methyl, ethyl, butyl, octyl or phenyl.

It is particularly preferred that the hydroxy group be in the 2-position in which case it is preferably a tertiary hydroxy group which defines a hydroxy group carried by a carbon atom that has its remaining three valences connected to other carbon atoms. Particularly preferred compounds have the Formula XI:

in which each $R^p$ is independently an alkyl group containing from 1 to 4 carbon atoms. In the commercial product Darocur 1173 (available from E-M Company, Hawthorne, N.Y.), each $R^p$ is methyl. This provides a compound which can be described as 2-hydroxy-2-methyl-1-phenyl propane 1-one. The "propane" is replaced by butane or hexane to describe the corresponding compounds, and these will further illustrate preferred compounds in this invention.

The benzoyl diaryl phosphine oxide photoinitiators which may be used herein have the Formula XII:

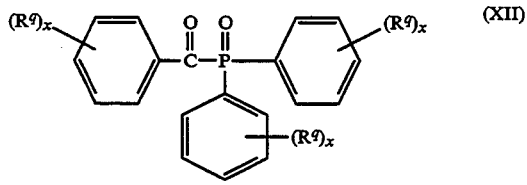

In Formula IX, $R^q$ is an optional hydrocarbon substituent containing from 1 to 10 carbon atoms and may be alkyl or aryl as previously noted, and each x is independently an integer from 1 to 3. In preferred practice, a 2,4,6-trimethyl benzoyl compound is used, and the two aromatic groups connected to the phosphorus atom are phenyl groups. This provides the compound 2,4,6-trimethyl benzoyl diphenyl phosphine oxide which is available from BASF under the trade designation Lucirin TPO.

When utilized, the photoinitiator is preferably present in an amount in the range of about 0.01 to about 10.0, more preferably about 0.1 to about 6.0, weight percent based on the total weight of the composition.

Suitable sources of actinic energy include lasers and other conventional light sources having an effective energy output, e.g., mercury lamps.

The wavelength of the actinic energy extends from the ultraviolet range, through the visible light range and into the infrared range. Preferred wavelengths are about 200 to about 2,000, more preferably about 250 to about 1,000, nanometers (nm).

The amount of actinic energy utilized to solidify a 3 mil thick film is about 0.05 to about 5.0, preferably about 0.1 to about 1 Joules per square centimeter (J/sqcm).

The monomers and compositions also can be thermally cured in the presence of a conventional thermal free-radical initiator, e.g., benzoyl peroxide, cyclohexanone peroxide N,N-azobis(isobutyrylnitrite), metallic dryer systems, redox systems, and the like.

The free-radical curable monomers and compositions of the present invention can be utilized, as coatings (especially as primary and secondary optic glass fiber coatings), in a metallization process wherein a non-metallic substrate is provided with a metal finish, to produce objects utilizing an optical fabrication process as described in U.S. Pat. No. 4,575,330 to Hull, in composite materials and other applications.

The following Examples are presented by way of representation, and not limitation, of the present invention.

EXAMPLE 1

Comparison of Compositions Containing Varying Ratios of Maleate to Vinyl Ether Groups A flask was fitted with a variable speed stirrer, thermometers, a snyder column, a condenser with a dean-starke trap, a nitrogen inlet tube and a heating mantle. One equivalent of n-butyl cellosolve (ethylene glycol mono-n-butyl ether available from Union Carbide) and one mole of maleic anhydride were charged into the flask and heated to about 120° C. for about 2 hours. Then about 1.1 moles of propylene oxide was added over about 2 hours at 60° C. and the reaction was slowly heated to about 110° C. until an acid value of less than 10 was reached. Then 1 equivalent of Desmodur N-100 (aliphatic polyisocyanate available from Miles Chemical) and 0.03% dibutyltin dilaurate were added and the reaction was heated at 60°–70° C. until no isocyanate peak was observed in the infra-red spectra. The theoretical equivalent weight per maleate double bond was 441.

The above urethane-maleate was mixed with Rapi-Cure DVE-3 (equivalent weight per vinyl ether double bond 101) at various ratios, 0.2% phenothiazine and Darocur 1173 at 4% and then tested for UV cure properties on unprimed aluminum panels. The results are shown below:

| Maleate to Vinyl Ether Ratio: | 2:1 | 1:1 | 2:3 |
|---|---|---|---|
| Brookfield Viscosity (cP) | 18,600 | 5440 | 2000 |
| MEK double rubs (1 J/cm$^2$) | >200 | >200 | >200 |
| MEK double rubs (0.5 J/cm$^2$) | — | >200 | — |
| Pencil Hardness (1 J/cm$^2$) | 2 H | 2 H | 2 H |

EXAMPLE 2

Curable Compositions

A composition of the present invention was prepared and tested as a coating composition.

The urethane-maleate resin was prepared by reacting the cycloaliphatic diisocyanate commercially available under the trade designation Desmodur W from Miles Chemical with the maleate half ester from butyl carbitol and maleic anhydride which had been reacted with propylene oxide. The final isocyanate level was 0.5%. The theoretical equivalent weight was 369 g per maleate double bond. The composition contained 80.0 g of the urethane-maleate resin, 20.0 g of DVE-3, 4.0 g of Darocur 1173 and 0.1 g phenothiazine and had a viscosity at 25° C. of 2,800 cP.

The test results for films produced using a UV cure dose of 0.5 J/sqcm are provided in Table I.

TABLE I

| Test | Result |
|---|---|
| TEST RESULTS | |
| MEK double rubs | >200 |
| Pencil Hardness | H |
| Tensile Properties | |
| Tensile Strength (MPa) | 16 |
| Elongation (%) | 8 |
| Modulus (MPa) | 300 |
| 60% Gloss (On paper) | 89 |
| Adhesion (%) to: | |
| Wood | Good |
| Polycarbonate | 100 |
| Unprimed Aluminum | 0 |
| Primed Aluminum[1] | 100 |

[1]Primed with 5% of the product A-1120 from Union Carbide

EXAMPLE 3

Curable Composition Having Urethane-Maleate Mixtures

A coating formulation containing the urethane-maleate oligomers from Example 2 and Example i was prepared as below:

| | |
|---|---|
| Urethane-maleate of Example 2 | 58.4 parts |
| Urethane-maleate of Example 1 | 24.0 parts |
| DVE-3 | 17.6 parts |
| Darocur 1173 | 4.0 parts |

This formulation was drawn down on primed aluminum using a #40 wire wound rod. The film had >200 MEK double rubs when UV cured at 1.0 and 0.5 J/cm$^2$. The coating had a pencil hardness of H and showed 100% crosshatch adhesion.

EXAMPLE 4

Curable Compositions Having Urethane-Maleate Mixtures

A formulation was prepared containing the urethane-maleate oligomers from Example 2 and Example 1 was prepared as below:

| | |
|---|---|
| Urethane-maleate of Example 2 | 33.4 parts |

-continued

| | |
|---|---|
| Urethane-maleate of Example 1 | 33.3 parts |
| DVE-3 | 33.3 parts |
| Darocur 1173 | 4.3 parts |
| Phenothiazine | 0.1 parts |
| FC 430[1] | 0.1 parts |

[1]Fluorocarbon additive available from 3M Co.

The formulation had a viscosity of 380 cP and when drawn down on polycarbonate using a #3 wire wound rod and UV cured at 1 J/cm$^2$ gave 50 MEK double rubs, a 2B pencil hardness and 60–75% crosshatch adhesion using #610 scotch tape. A film UV cured at 3 J/cm$^2$ had a tensile strength of 3 MPa, an elongation of 10% and a modulus of 40 MPa.

EXAMPLE 5

Electron Beam Curable Urethane-Maleate Compositions

A formulation containing the urethane-maleate oligomer of Example 2 was evaluated for cure by electron beam. Thus, 80.0 grams of the urethane-maleate of Example 2 was mixed with 20.0 grams of DVE-3. The MEK resistance of films EB cured at various doses is shown below:

| Dose (Mrads) | MEK Double Rubs |
|---|---|
| 2.0 | 36 |
| 4.0 | 86 |
| 8.0 | 131 |
| 12.0 | >200 |
| 16.0 | >200 |

EXAMPLE 6

Wood coating Composition

A wood coating formulation was prepared containing 80.0 grams of the urethane-maleate of Example 2, 20.0 grams of DVE-3, 4.0 grams of Darocur 1173 and 0.2 grams of phenothiazine. The properties are shown below:

| | |
|---|---|
| Viscosity (cP) | 330 |
| Gardner color | 9 |
| Odor | OK |
| Clarity | Cloudy |
| MEK double rubs (0.5 J/cm$^2$) | 200 |
| NEK double rubs (1.0 J/cm$^2$) | 200 |
| Adhesion to wood | Good |
| Pencil hardness | H |
| Flexibility | Flexible |
| Gloss 60° (paper) | 89 |

EXAMPLE 7

Curable Composition Containing Urethane-Maleates

A flask was fitted with a variable speed stirrer, thermometers, a snyder column, a condenser with a dean-starke trap, a nitrogen inlet tube and a heating mantle. One equivalent of n-butyl cellosolve and one mole of maleic anhydride were charged into the flask and heated to about 120° C. for about 2 hours. Then about 1.1 mole of propylene oxide was added over about 2 hours at 60° C. and the reaction was slowly heated to about 110° C. until an acid value of less than 10 was reached. Then 1 equivalent of isophorone diisocyanate and 0.03% dibutyltin dilaurate were added and the reaction was heated at 60°–70° C. until a free isocyanate of about 0.39% was obtained. The theoretical equivalent weight per maleate double bond was 384.

A formulation containing 76.0% of the above urethane-maleate, 20.0% Rapi-Cure DVE-3 (equivalent weight per vinyl ether double bond 101) and 4% Darocur 1173 had a viscosity of 1775 cP. A film IrV cured at 1 J/cm$^2$ had >200 MEK double rubs and a pencil hardness of H.

EXAMPLE 8

Curable Composition Containing Maleate Terminated Aromatic Urethane

A flask was fitted with a variable speed stirrer, thermometers, a snyder column, a condenser with a dean-starke trap, a nitrogen inlet tube and a heating mantle. One equivalent of n-butyl cellosolve and one mole of maleic anhydride were charged into the flask and heated to about 120° C. for about 2 hours. Then about 1.1 mole of propylene oxide was added over about 2 hours at 60° C. and the reaction was slowly heated to about 110° C. until an acid value of less than 10 was reached. Then 1 equivalent of toluene diisocyanate and 0.03% dibutyltin dilaurate were added and the reaction was heated at 60°–70° C. until no isocyanate peak was observed in the infrared spectra. The theoretical equivalent weight per maleate double bond was 361. The number average molecular weight was 1200 daltons and the weight was 1400 daltons.

A coating formulation prepared from 75.0 grams of the above urethane-maleate resin, 21.0 grams of DVE-3 and 4.0 grams of Darocur 1173 had a viscosity of 1285 cP. A film UV cured at 1 J/cm$^2$ had >200 MEK double rubs and a pencil hardness of F. A film UV cured at 2 J/cm$^2$ showed an isothermal weight loss of 18% in air after 40 minutes at 200° C.

EXAMPLE 9

Curable Composition Prepared From Maleate Terminated Urethane Prepolymer

A flask was fitted with a variable speed stirrer, thermometers, a snyder column, a condenser with a dean-starke trap, a nitrogen inlet tube and a heating mantle. One equivalent of n-butyl cellosolve and one mole of maleic anhydride were charged into the flask and heated to about 120° C. for about 2 hours. Then about 1.1 mole of propylene oxide was added over about 2 hours at 60° C. and the reaction was slowly heated to about 110° C. until an acid value of less than 10 was reached. Then 1 equivalent of Adiprene L-315 a toluene diisocyanate terminated polytetrahydrofuran oligomer available from Uniroyal and 0.03% dibutyltin dilaurate were added and the reaction was heated at 60°–70° C. until no isocyanate peak was observed in the infra-red spectra. The theoretical equivalent weight per maleate double bond was 724. The number average molecular weight was 2300 daltons and the weight was 3700 daltons.

A coating formulation was prepared from 84.3 grams of the above urethane-maleate resin, 11.7 grams of DVE-3 and 4.0 grams of Darocur 1173. A film UV cured at 2 J/cm$^2$ had 48 MEK double rubs and a pencil hardness of 4B.

EXAMPLE 10

Curable Composition Containing Maleate Terminated Urethane Vinyl Ether With Added Acrylate Oligomer A coating formulation was made containing 56.0 grams of the urethane-maleate oligomer of Example 2, 30.0 grams of Photomer 5007 (a polyester acrylate oligomer available from Henkel), 14.0 grams DVE-3, 7 grams of Darocur 1173 and 0.1 grams of phenothiazine. A film cured at 0.5 J/cm² had >200 MEK double rubs.

We claim:

1. A free-radical radiation curable composition comprising:
   a) at least one compound containing from one to about six vinyl ether groups; and
   b) at least one compound containing a urethane backbone with from one to about six maleate and/or fumarate end groups, wherein the ratio of vinyl ether groups to maleate and/or fumarate groups is in the range of about 2:1 to about 1:2.

2. The composition of claim 1 wherein the maleate and/or fumarate compound is the product of the reaction of at least one monohydroxy functional maleate and/or fumarate compound and at least one organic polyisocyanate compound.

3. The composition of claim 2 wherein component b) has a number average molecular weight of about 150 to about 5000.

4. The composition of claim 2 wherein the monohydroxy functional maleate and/or fumarate compound is obtained by the reaction of a half-ester of maleic and/or fumaric acid with ethylene oxide or propylene oxide.

5. The composition of claim 2 wherein the organic polyisocyanate compound is a difunctional isocyanate monomer or an isocyanate prepolymer obtained by the reaction of a isocyanate monomer and a polyether, polyester or polycarbonate polyol.

6. The composition of claim 1 wherein the vinyl ether compound has the formula:

where m is an integer from 1 to 6;
$R^1$ is the residue of an organic alcohol or polyol, substantially free of maleate or fumarate groups, with a molecular weight of from 56 to 2000; and
$R^2$ is hydrogen or methyl.

7. The composition of claim 5 wherein the value of m is 2 to 4.

8. The composition of claim 1 where the ratio of vinyl ether to maleate and/or fumarate groups is about 1:1.

9. The composition of claim 1 that further comprises 0.1 to 10 weight percent based on the total weight of the composition of at least one free radical photoinitiator.

10. The composition of claim 10 where the photoinitiator is

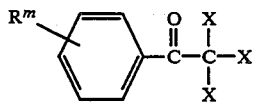

where $R^m$ is an optional alkyl or aryl hydrocarbon substituent containing from 1 to 10 carbon atoms, and
x is selected from the group consisting of hydroxy, $C_1$ to $C_4$ alkyoxy, $C_1$ to $C_8$ alkyl, cycloalkyl, halogen, and phenyl, or 2 Xs together are cycloalkyl, and at least one X is selected from the group consisting of hydroxy and $C_1$ to $C_4$ alkoxy.

11. The composition of claim 9 where the photoinitiator is

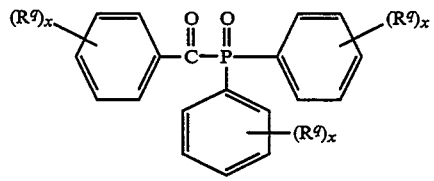

where $R^q$ is an optional hydrocarbon substituent containing from 1 to 10 carbon atoms; and
x is independently an integer from 1 to 3.

12. The composition of claim 1 that also includes up to 50 weight percent based on the total weight of the composition of acrylate or methacrylate terminated monomers or oligomers with molecular weights ranging from about 250 to 5000 and average functionalities from about 1 to 4.

13. The composition of claim 1 which also contains up to 80 weight percent based on the total weight of the composition of a compound of the formula:

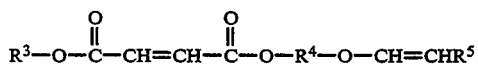

where $R^3$ is selected from the group consisting of:
a) alkyl, cycloalkyl, aryl or alkaryl groups, with 1 to 10 carbon atoms and can contain 0 or N heteroatoms,
b) H, or
c) metal ions;
$R^4$ is selected from the group consisting of alkyl, cycloalkyl, aryl or alkaryl groups with 1 to 10 carbon atoms and can contain 0 or N heteroatoms; and
$R^5$ is H or methyl.

14. The composition of claim 1 that further comprises up to about 40 weight percent based on the total weight of the composition of at least one additive selected from the group consisting of pigments, fillers, wetting agents, stabilizers, and combinations thereof.

15. The composition of claim 1 where the vinyl ether compound is triethyleneglycol divinyl ether.

16. The composition of claim 1 where the vinyl ether compound is 1,4-cyclohexane dimethanol divinyl ether.

17. The composition of claim 1 where the vinyl ether compound is a urethane-vinyl ether oligomer.

18. A substrate coated with a composition of claim 1.

19. A substrate coated with a cured composition of claim 1.

20. The coated substrate in accordance with claim 19 wherein the substrate is selected from the group of glass, paper, wood, rubber, metal, concrete, leather, fabric, fiber and plastic.

21. A free radical radiation curable composition comprising
(a) at least one vinyl ether compound of the formula:

where m is an integer from 1 to 6;

$R^1$ is the residue of an organic alcohol or polyol with a molecular weight of from 56 to 2,000; and $R^2$ is hydrogen or methyl; and (b) at least one maleate and/or fumarate compound containing from 1 to about 6 maleate and/or fumarate end groups that is obtained by the reaction of at least one organic polyisocyanate compound with a monohydroxy functional maleate and/or fumarate compound, wherein the monohydroxy maleate and/or fumarate compound is the product of the reaction of a half ester of maleic and/or fumaric acid with ethylene oxide or propylene oxide and the ratio of vinyl ether groups in (a) to maleate and/or fumarate groups in (b) is in the range of about 2:1 t about 1:2.

* * * * *

UNITED STATES PATENT AND TRADEMARK OFFICE
CERTIFICATE OF CORRECTION

PATENT NO. : 5,340,653
DATED : August 23, 1994
INVENTOR(S) : Noren et al.

It is certified that error appears in the above-indentified patent and that said Letters Patent is hereby corrected as shown below:

Title Page:
Item [73] Assignee: delete [Galeen" and insert --Geleen--.

Item [57] Abstract, line 9, delete "1to about 1:5] and insert --5:1 to about   1:5--.

Column 1, line 14, after "and" insert --U.S.--.

Column 5, line 56 (Formula V), delete $$[CH_3\text{-}(CH_2)_x(0\text{-}CH_2CHR)_y\text{-}0\text{-}\overset{O}{\underset{\|}{C}}\text{-}CH=CH\text{-}\overset{O}{\underset{\|}{C}}\text{-}OH]$$

and insert $$--CH_3\text{-}(CH_2)_x\text{-}(-O-CH_2CHR)_y - O-\overset{O}{\underset{\|}{C}}-CH=CH-\overset{O}{\underset{\|}{C}}-OH--$$

Column 12, (Example 3), line 46, delete [Example i] and insert --Example 1--.

Column 13, line 61, delete [flask-and] and insert --flask and--.

Column 14, line 7, delete [A film IrV] and insert --A film UV--.

UNITED STATES PATENT AND TRADEMARK OFFICE
CERTIFICATE OF CORRECTION

PATENT NO. : 5,340,653

DATED : August 23, 1994

INVENTOR(S) : Noren et al.

It is certified that error appears in the above-indentified patent and that said Letters Patent is hereby corrected as shown below:

Column 16, Claim 20, delete [19] and insert --18 or 19--.

Signed and Sealed this

Twenty-second Day of November, 1994

Attest:

BRUCE LEHMAN

Attesting Officer

Commissioner of Patents and Trademarks